(12) United States Patent
Bolster, Jr.

(10) Patent No.: US 8,217,649 B2
(45) Date of Patent: Jul. 10, 2012

(54) SYSTEM FOR USE IN MR IMAGING USING TISSUE MECHANICAL RESONANCE

(75) Inventor: Bradley Drake Bolster, Jr., Rochester, MN (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 373 days.

(21) Appl. No.: 12/684,254

(22) Filed: Jan. 8, 2010

(65) Prior Publication Data

US 2010/0176810 A1 Jul. 15, 2010

Related U.S. Application Data

(60) Provisional application No. 61/143,595, filed on Jan. 9, 2009.

(51) Int. Cl.
*G01V 3/00* (2006.01)
(52) U.S. Cl. ........................................ 324/307; 324/309
(58) Field of Classification Search .......... 324/300–322; 600/407–422
See application file for complete search history.

(56) References Cited

U.S. PATENT DOCUMENTS

| | | | |
|---|---|---|---|
| 5,517,992 A * | 5/1996 | Opsahl et al. | 600/410 |
| 5,592,085 A | 1/1997 | Ehman | |
| 5,825,186 A | 10/1998 | Ehman et al. | |
| 6,486,669 B1 | 11/2002 | Sinkus et al. | |
| 6,879,155 B2 | 4/2005 | Ehman et al. | |
| 7,259,558 B2 | 8/2007 | Bieri et al. | |
| 7,693,567 B2 * | 4/2010 | Tsonton et al. | 600/411 |
| 8,058,872 B2 * | 11/2011 | Hyde et al. | 324/307 |
| 8,106,655 B2 * | 1/2012 | Hyde et al. | 324/307 |

OTHER PUBLICATIONS

Bensamoun et al., "Rapid Magnetic Resonance Elastography of Muscle Using One-dimensional Projection", J. Magn Reson Imaging, May 2008; 27(5) pp. 1083-1088.
Ashach et al., "Assessment of Liver Visoelesticity Using Multifrequency MR Elastography", Magn Reson Med. Aug. 2008; 60(2), pp. 373-379.
Glaser et al., "Rapid MR Elastography Using Selective Excitations", Magn Reson Med, 2006; 55, pp. 1381-1389.

* cited by examiner

Primary Examiner — Brij Shrivastav
(74) Attorney, Agent, or Firm — Alexander J Burke

(57) ABSTRACT

A system for use in MR imaging using tissue mechanical resonance includes an external wave generator for generating mechanical waves for transmission through patient anatomy. An RF pulse generator generates an RF pulse for exciting nuclei magnetic moments at specific spin frequencies in a particular selected anatomical region of interest. A motion encoding gradient generator generates a motion encoding gradient magnetic field within a time duration of a read-out gradient and synchronized with generation of the mechanical waves. A data processor processes data derived from radio frequency signals resulting from nuclei spin frequencies responsive to the motion encoding gradient magnetic field to detect the mechanical waves propagating through the patient anatomy.

20 Claims, 4 Drawing Sheets

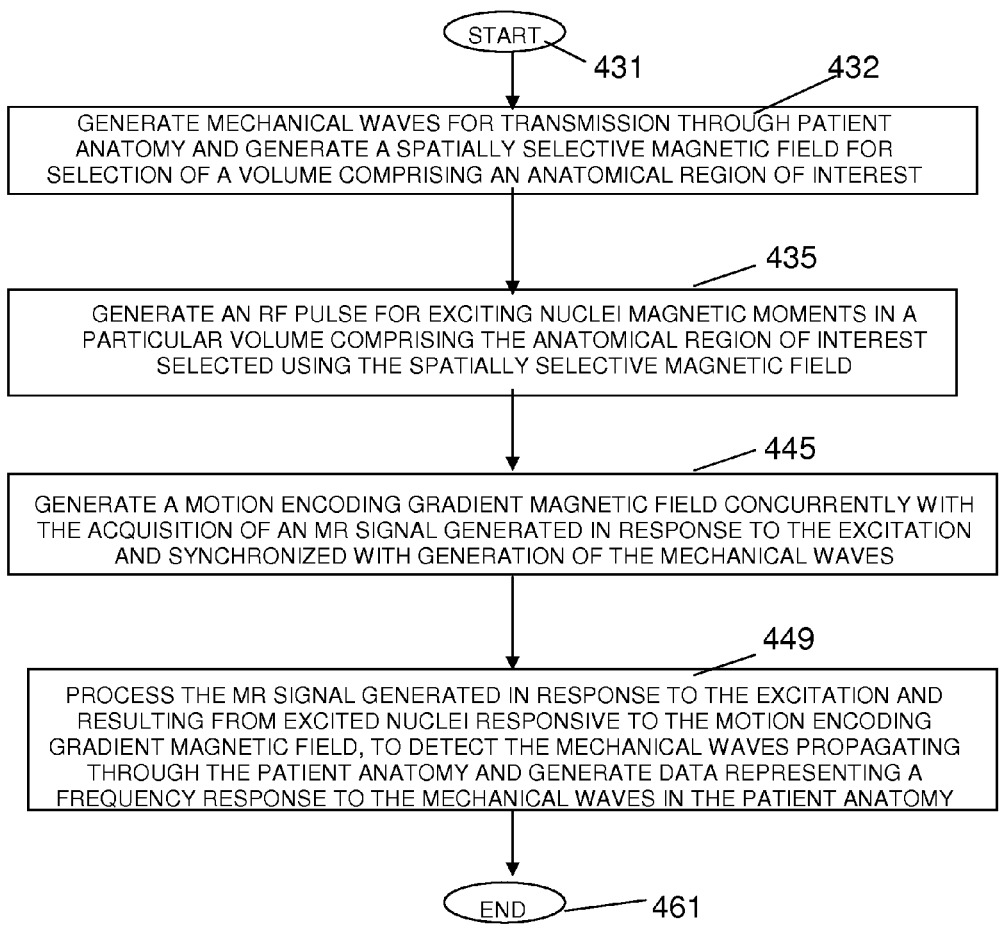

SYSTEM FOR USE IN MR IMAGING USING TISSUE MECHANICAL RESONANCE

This is a non-provisional application of provisional application Ser. No. 61/143,595 filed Jan. 9, 2009, by B. D. Bolster Jr.

FIELD OF THE INVENTION

This invention concerns a system for magnetic resonance (MR) imaging, and more particularly for image acquisition and assessment of changes in tissue mechanical properties in response to disease.

BACKGROUND OF THE INVENTION

In addition to exhibiting changes in stiffness, measured with indexes such as Young's modulus, tissues may undergo viscosity changes which impact the way these tissues respond to excitations of different frequencies. Known systems involve generating imaging mechanical waves in tissues in response to an external excitation. The sector of magnetic resonance imaging encompassing these systems is known as Magnetic Resonance Elastography (MRE). These known systems employ a motion encoding gradient (MEG) embedded in a rapid imaging sequence such as gradient echo or echo planar imaging. An external device capable of generating and transmitting mechanical waves into the body is synchronized in frequency and phase to the MEG. By acquiring phase images, the combination of the external wave generator and the MEG enables the visualization of mechanical shear waves as they propagate through the tissue being interrogated. Through an analytical "inversion" process, the measured mechanical wavelengths are converted into a quantitative estimate of shear modulus.

Extensions of these known systems allow the acquisition of multi-spectral information. This is accomplished by either acquiring separate MRE data at different frequencies or by utilizing bandpass filtering to generate images at different frequencies. These systems require substantial post processing and longer acquisition times to collect the data. A system according to invention principles addresses these deficiencies and related problems.

SUMMARY OF THE INVENTION

A system that enables rapid non-invasive assessment of the mechanical frequency response of biological tissues. A system for use in MR imaging using tissue mechanical resonance, comprises an external wave generator for generating mechanical waves for transmission through patient anatomy. A spatially selective gradient generator generates a spatially selective magnetic field for selection of a volume comprising an anatomical region of interest. An RF pulse generator generates an RF pulse for exciting nuclei magnetic moments in a particular volume comprising the anatomical region of interest selected using the spatially selective magnetic field. A motion encoding gradient generator generates a motion encoding gradient magnetic field concurrently with the acquisition of an MR signal generated in response to the excitation. The motion encoding gradient magnetic field is synchronized with generation of the mechanical waves. A data processor processes the MR signal generated in response to the excitation and resulting from excited nuclei responsive to the motion encoding gradient magnetic field, to detect the mechanical waves propagating through the patient anatomy and generate data representing a frequency response to the mechanical waves in the patient anatomy.

BRIEF DESCRIPTION OF THE DRAWING

FIG. 4 shows a flowchart of a process performed by a system for use in MR imaging using tissue mechanical resonance, according to invention principles.

DETAILED DESCRIPTION OF THE INVENTION

A system enables rapid non-invasive assessment of mechanical frequency response of biological tissues and enables measurement of multi-frequency tissue responses in a rapid non-invasive manner and without requiring significant post processing resources to obtain information. The system eliminates the need for spatial encoding in a sequence and collects multi-frequency data directly allowing assessment of spectral shape related to the tissue being interrogated.

Figure 1:
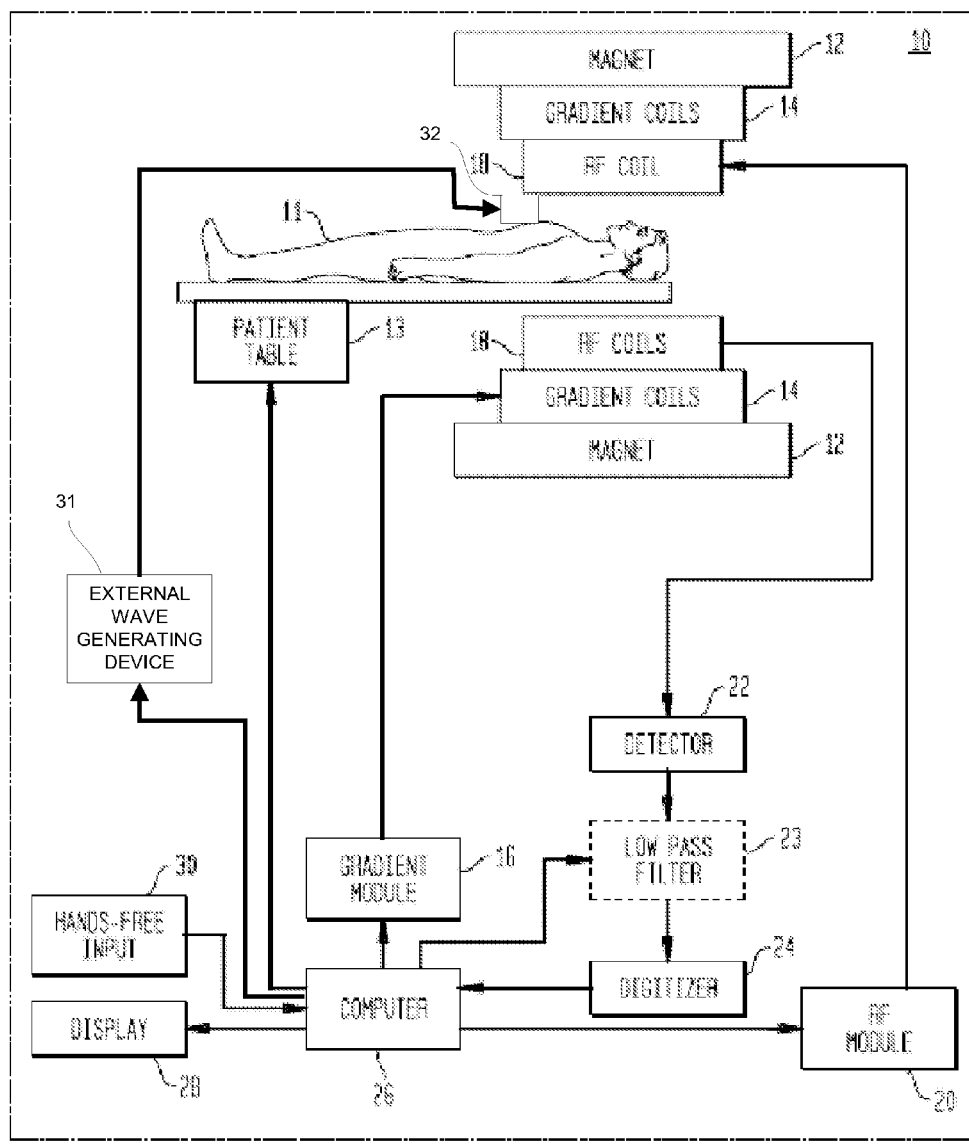
FIG. 1 shows a system for use in MR imaging using tissue mechanical resonance, according to invention principles.

FIG. 1 shows system 10 for use in MR imaging using tissue mechanical resonance. In system 10, magnet 12 creates a static base magnetic field in the body of patient 11 to be imaged and positioned on a table 13. Within the magnet system are gradient coils 14 for producing position dependent magnetic field gradients superimposed on the static magnetic field. Gradient coils 14, in response to gradient signals supplied thereto by a gradient and shimming and pulse sequence control module 16, produce position dependent and shimmed magnetic field gradients in three orthogonal directions and generates pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11. Further RF (radio frequency) module 20 provides RF pulse signals to RF coil 18, which in response produces magnetic field pulses which excite the spins of the protons in the imaged body. Pulse sequence control module 16 in conjunction with RF module 20 as directed by computer 26, control slice-selection, phase-encoding, readout gradient magnetic fields, radio frequency transmission, and magnetic resonance signal detection, to acquire magnetic resonance signals representing a single voxel, another localized anatomical 3 dimensional volume or planar slices of patient 11.

In response to applied RF pulse signals, RF coil 18 receives MR signals, i.e., signals from the excited protons within the body as they return to an equilibrium position established by the static and gradient magnetic fields. The MR signals are detected by a detector 22 (comprising a preamplifier and amplifier), the MR signals are then filtered by an analog low-pass filter 23 (the pass band of which is controlled directly or indirectly by the pulse sequence and computer 26), converted into digital signals by a digitizer 24 and provided to the MR system computer 26. Alternatively, a digital filter in unit 26 may be used instead of, or in conjunction with, the analog low-pass filter 23. The MR signals are detected and processed by a detector within RF module 20 to provide image representative data to an image data processor in computer 26. An ECG synchronization signal generator (not shown to preserve drawing clarity) provides ECG signals acquired from patient 11 to computer 26 for use in pulse sequence and imaging synchronization.

External wave generator 31 generates mechanical waves for transmission through patient 11 anatomy. RF pulse generator 20 generates an RF pulse for exciting nuclei magnetic moments at specific spin frequencies in a particular selected anatomical region of interest (ROI). Motion encoding gradient generator 16 generates a motion encoding gradient magnetic field simultaneous with the acquisition of the MR signal and synchronized with the generation of the mechanical waves. A data processor (computer) 26 processes data derived from radio frequency signals resulting from nuclei spin frequencies responsive to the motion encoding gradient magnetic field to detect the mechanical waves propagating through the patient 11 anatomy. The data derived from radio frequency signals is derived substantially without use of a spatial encoding gradient magnetic field.

Computer 26 uses information stored in an internal database to process the detected MR signals in a coordinated manner to generate high quality images of a selected planar slice (or slices) of the body and adjust other parameters of system 10. Computer 26 similarly generates graphical representations of a broad spectrum frequency response to mechanical waves through patient anatomy. The stored information comprises predetermined pulse sequence and magnetic field gradient and strength data as well as data indicating timing, orientation and spatial volume of gradient magnetic fields to be applied in imaging. Generated images and data are presented on display 28. Computer 26 includes a graphical user interface (GUI) enabling user interaction with the computer via a user data entry device (not shown) or a hands free interface 30 (such as a voice recognition unit, for example) and enabling user modification of magnetic resonance imaging signals in substantially real time.

Figure 2:
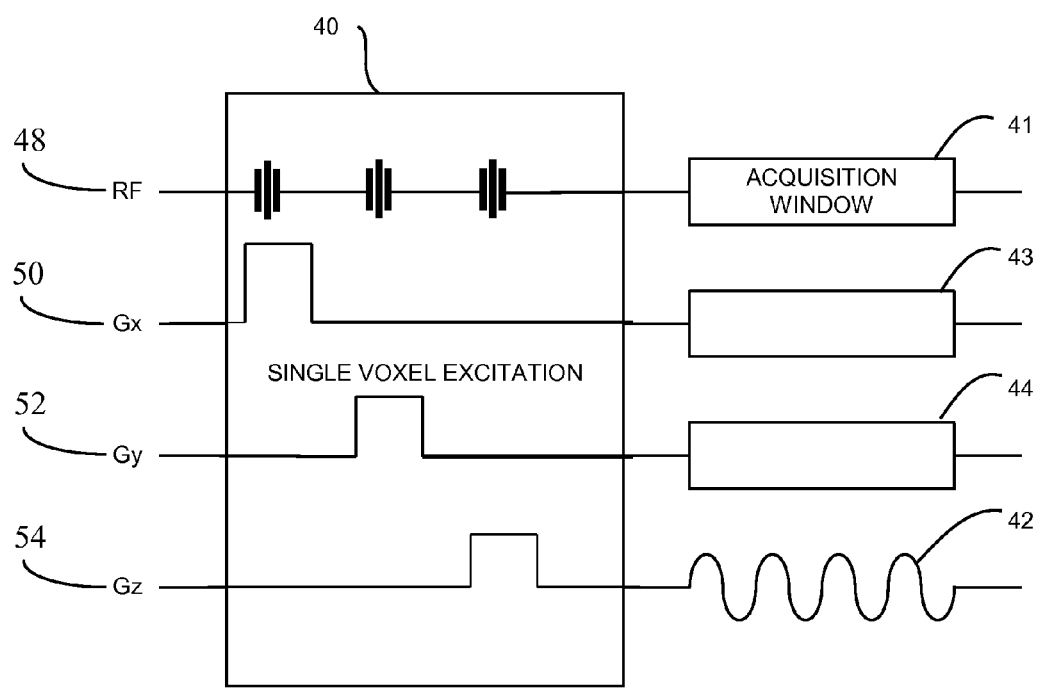
FIGS. 2 and 3 show a pulse sequence and process employed by a system for use in MR imaging using tissue mechanical resonance, according to invention principles.
Figure 3:
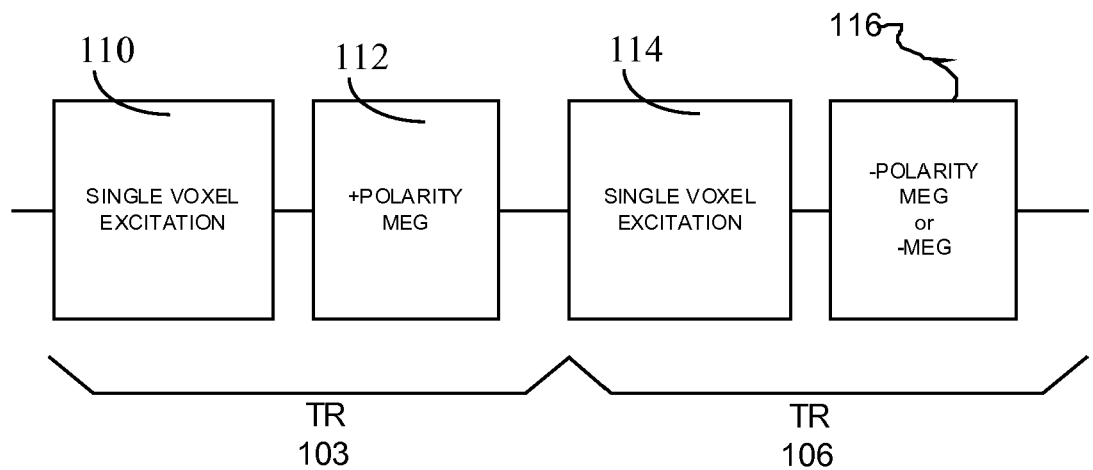

FIGS. 2 and 3 show a pulse sequence and process employed by system 10 for use in MR imaging using tissue mechanical resonance. System 10 (FIG. 1) advantageously applies single voxel (or another localized anatomical 3 dimensional volume) excitation pulse sequence 40 (FIG. 2) which eliminates the need for spatial encoding during readout in the sequence. Because spatial encoding is not necessary during readout, the motion encoding gradient (MEG) (42) may be advantageously applied during the readout window (acquisition window 41). This reduces the minimum Echo Time (TE) for the sequence and allows system 10 to reduce the time required for averaged image acquisitions of the volume of interest. External wave generating device 31 is used to generate waves in the tissue of patient 11 in synchrony with the volume excitation.

System 10 provides the single voxel (or another localized anatomical 3 dimensional volume) excitation pulse sequence 40. Pulse sequence 40 uses gradient module 16 for generating magnetic gradient fields Gx 50, Gy 52 and Gz 54 (spatial x, y and z dimension components) superposed on static magnetic fields together with synchronized RF excitation pulse sequence 48 provided by unit 20. Because spatial encoding is not necessary during readout window 41, the motion encoding gradient (MEG) (42) may be advantageously generated by unit 16 and applied during the readout window (acquisition window 41) on any gradient axis or combination of axes comprising a sinusoidal gradient waveform, a trapezoidal gradient waveform, or a broadband gradient waveform, such as a sync waveform or a chirp waveform, for example. Further the gradient may be of alternating polarity during successive repetition time (TR) intervals, for example. The combination of gradient magnetic fields Gx 50, Gy 52 and Gz 54 and RF signals 48, excite a single voxel, for example, and during acquisition window 41 MR signals are detected and processed. The FIG. 2 pulse sequence is used for acquiring MR image data in response to RF pulses of signal 48 provided by RF module 20 and in response to mechanical waves propagated by external wave generator 31 for transmission through patient anatomy. The RF pulses excite nuclei magnetic moments in a single voxel of an anatomical region of interest and RF coil 18 receives MR signals, i.e., signals from the excited protons within the body as they return to an equilibrium position established by the static and gradient magnetic fields and in response to mechanical waves propagated by external wave generator 31 and tissue resonance. Computer 26 applies a Fourier transform to acquired MR image data within a mechanical frequency response spectrum centered on a fundamental frequency of an applied excitation.

FIG. 3 shows successive imaging repetitive time (TR) intervals 103 and 106 individually comprising imaging pulse sequences employed by system 10 (FIG. 1) for use in MR imaging using tissue mechanical resonance. System 10 in step 110 performs MR imaging acquisition in TR interval 103 employing single voxel excitation sequence 40 (FIG. 2) and in step 112 performs an MR imaging acquisition using a first polarity MEG as illustrated in FIG. 2. System 10 in step 114 performs MR imaging acquisition in successive TR interval 106 employing single voxel excitation sequence 40 (FIG. 2) and in step 116 performs an MR imaging acquisition using a second polarity MEG (substantially opposite to the first polarity) as illustrated in FIG. 2. The successive acquisition of MR imaging data sets in successive TR intervals using a MEG of substantially opposite polarity enables computer 26 to subtract out and remove baseline drift and other artifacts. In another embodiment, System 10 in step 114 performs MR imaging acquisition in successive TR interval 106 employing single voxel excitation sequence 40 (FIG. 2) and in step 116 performs an MR imaging acquisition without a MEG enabling computer 26 to subtract out and remove baseline drift and other artifacts.

In further embodiments, system 10 employs a known single voxel excitation method such as Point Resolved Spectroscopy (PRESS) or Stimulated Echo Acquisition Mode (STEAM). In other embodiments unit 31 (FIG. 1) applies a sinusoidal mechanical excitation or a broadband mechanical excitation. The broadband mechanical excitation may comprise a chirp pulse, an impulse, or a sync waveform synchronized with single voxel excitation of pulse sequence 40. In a further arrangement, this mechanical excitation is used in conjunction with a sinusoidal or trapezoidal MEG or a broadband MEG. Computer 26 in an additional embodiment employs respiratory triggering and compensation such as a known Prospective Acquisition Correction (PACE) method during MR imaging acquisition.

FIG. 4 shows a flowchart of a process performed by system 10 for use in MR imaging using tissue mechanical resonance. In step 432 following the start at step 431, external wave generator 31 (FIG. 1) generates mechanical waves for transmission through patient 11 anatomy and a spatially selective gradient generator generates a spatially selective magnetic field for selection of a volume comprising an anatomical region of interest. The external wave generation comprises a broadband mechanical excitation synchronized with the volume excitation. Specifically, external wave generator 31 generates mechanical waves in the form of a chirp pulse, an impulse or a sync waveform, for example. RF pulse generator 20 in step 435 generates an RF pulse for exciting nuclei magnetic moments in a particular volume comprising the anatomical region of interest selected using the spatially selective magnetic field. The particular selected anatomical region of interest is an anatomical region substantially smaller than an image slice such as an individual voxel or an anatomical region represented by a 3 dimensional volume subdivided into an array of voxels using chemical shift imaging (CSI) spatial encoding techniques. In step 445 motion encoding gradient generator 16 generates a motion encoding gradient magnetic field concurrently with the acquisition of an MR signal generated in response to the excitation. The motion encoding gradient magnetic field is synchronized with generation of the mechanical waves. The motion encoding gradient magnetic field comprises a sinusoidal gradient waveform, a trapezoidal gradient waveform, a broadband gradient waveform, a sync waveform or a chirp waveform, for example.

In step 449, data processor (computer) 26 processes the MR signal generated in response to the excitation and resulting from excited nuclei responsive to the motion encoding gradient magnetic field, to detect the mechanical waves propagating through the patient anatomy and generate data representing a frequency response to the mechanical waves in the patient anatomy and generate data representing a frequency response to the mechanical waves in the patient anatomy. The data derived from radio frequency signals is derived without use of a spatial encoding gradient magnetic field. In one embodiment the data derived from radio frequency signals is derived in response to respiratory triggering and compensation using PACE (phase constrained encoding) data acquisition. Data processor 26 characterizes the mechanical waves and generates visualization data for display representing a broad spectrum frequency response to the mechanical waves through the patient anatomy by utilizing both phase and magnitude information from the acquired data. The process of FIG. 4 terminates at step 461.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a controller or microprocessor, for example, and is conditioned using executable instructions to perform special purpose functions not performed by a general purpose computer. A processor may be coupled (electrically and/or as comprising executable components) with any other processor enabling interaction and/or communication there-between. A display processor or generator is a known element comprising electronic circuitry or software or a combination of both for generating display images or portions thereof.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A user interface (UI), as used herein, comprises one or more display images, generated by a display processor and enabling user interaction with a processor or other device and associated data acquisition and processing functions.

The UI also includes an executable procedure or executable application. The executable procedure or executable application conditions the display processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of FIGS. 1-4 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system accelerates non-invasive assessment of mechanical frequency response of biological tissues and acquires multi-frequency data directly allowing assessment of spectral shape related to tissue being examined. Further, the processes and applications may, in alternative embodiments, be located on one or more (e.g., distributed) processing devices on the network of FIG. 1. Any of the functions and steps provided in FIGS. 1-4 may be implemented in hardware, software or a combination of both.

What is claimed is:

1. A system for use in MR imaging using tissue mechanical resonance, comprising:

an external wave generator for generating mechanical waves for transmission through patient anatomy;

a spatially selective gradient generator for generating a spatially selective magnetic field for selection of a volume comprising an anatomical region of interest;

an RF pulse generator generating an RF pulse for exciting nuclei magnetic moments in a particular volume comprising said anatomical region of interest selected using said spatially selective magnetic field;

a motion encoding gradient generator for generating a motion encoding gradient magnetic field concurrently with the acquisition of an MR signal generated in response to the excitation, said motion encoding gradient magnetic field being synchronized with generation of said mechanical waves; and a data processor for processing the MR signal generated in response to the excitation and resulting from excited nuclei responsive to said motion encoding gradient magnetic field, to detect said mechanical waves propagating through said patient anatomy and generate data representing a frequency response to said mechanical waves in said patient anatomy.

2. A system according to claim 1, wherein
said data derived from radio frequency signals is derived without use of a spatial encoding gradient magnetic field within the time duration of a magnetic field read-out gradient.

3. A system according to claim 2, wherein
said particular selected anatomical region of interest is a single volume substantially smaller than an image slice but larger than an imaging voxel.

4. A system according to claim 3, wherein
said particular selected anatomical region of interest is a volume subdivided into multiple voxels each being substantially smaller than an image slice but larger than an imaging voxel.

5. A system according to claim 3, wherein
said particular selected anatomical region of interest is an anatomical region represented by an individual voxel.

6. A system according to claim 1, wherein
said data processor processes said data derived from radio frequency signals to characterize said mechanical waves through said patient anatomy.

7. A system according to claim 1, wherein
said data processor generates visualization data representing a broad spectrum frequency response to said mechanical waves through said patient anatomy.

8. A system according to claim 1, wherein
the external wave generation comprises a broadband mechanical excitation synchronized with the volume excitation.

9. A system according to claim 8 wherein
said external wave generator generates mechanical waves in the form of a chirp pulse.

10. A system according to claim 8 wherein
said external wave generator generates mechanical waves in the form of impulse.

11. A system according to claim 8 wherein
said external wave generator generates mechanical waves in the form of a sync-waveform.

12. A system according to claim 1, wherein
said motion encoding gradient magnetic field comprises a sinusoidal gradient waveform.

13. A system according to claim 1, wherein
said motion encoding gradient magnetic filed comprises an oscillating trapezoidal gradient waveform.

14. A system according to claim 1, wherein
said motion encoding gradient magnetic field comprises a broadband gradient waveform.

15. A system according to claim 14, wherein
said motion encoding gradient magnetic field comprises a sync waveform.

16. A system according to claim 14, wherein
said motion encoding gradient magnetic filed comprises a chirp waveform.

17. A system according to claim 1, wherein
said data derived from radio frequency signals is derived in response to respiratory triggering.

18. A system according to claim 11, wherein
said data derived from radio frequency signals is derived in response to respiratory triggering and compensation using PACE (phase constrained encoding) data acquisition.

19. A system according to claim 1, wherein
said data processor characterizes said mechanical waves and generates visualization data representing a broad spectrum frequency response to said mechanical waves through said patient anatomy by acquiring phase images converting measured mechanical wavelengths into a quantitative estimate of shear modulus.

20. A method for use in MR imaging using tissue mechanical resonance, comprising the activities of:
generating mechanical waves for transmission through patient anatomy;
generating a spatially selective magnetic field for selection of a volume comprising an anatomical region of interest;
generating an RF pulse for exciting nuclei magnetic moments in a particular volume comprising said anatomical region of interest selected using said spatially selective magnetic field;
generating a motion encoding gradient magnetic field concurrently with the acquisition of an MR signal generated in response to the excitation and synchronized with generation of said mechanical waves; and
processing the MR signal generated in response to the excitation and resulting from excited nuclei responsive to said motion encoding gradient magnetic field, to detect said mechanical waves propagating through said patient anatomy and generate data representing a frequency response to said mechanical waves in said patient anatomy.

\* \* \* \* \*